(12) United States Patent
Das et al.

(10) Patent No.: US 7,870,664 B2
(45) Date of Patent: Jan. 18, 2011

(54) METHOD OF MAKING CIRCUITIZED SUBSTRATE WITH A RESISTOR

(75) Inventors: Rabindra N. Das, Ithaca, NY (US);
John M. Lauffer, Waverly, NY (US);
Vova R. Markovich, Endwell, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 807 days.

(21) Appl. No.: 11/797,236

(22) Filed: May 2, 2007

(65) Prior Publication Data

US 2008/0151515 A1 Jun. 26, 2008

Related U.S. Application Data

(60) Division of application No. 11/172,786, filed on Jul. 5, 2005, now Pat. No. 7,235,745, which is a continuation-in-part of application No. 11/031,074, filed on Jan. 10, 2005, now Pat. No. 7,025,607.

(51) Int. Cl.
*H05K 3/30* (2006.01)

(52) U.S. Cl. .................. 29/832; 29/610.1; 29/613; 29/614; 29/615; 29/846; 29/852; 438/330; 438/396

(58) Field of Classification Search .................. 29/825, 29/846, 852; 438/330, 396
See application file for complete search history.

(56) References Cited

U.S. PATENT DOCUMENTS

| | | | |
|---|---|---|---|
| 5,016,085 A | 5/1991 | Hubbard et al. | |
| 5,026,624 A | 6/1991 | Day et al. | |
| 5,079,069 A | 1/1992 | Howard et al. | |
| 5,099,309 A | 3/1992 | Kryzaniwsky | |
| 5,162,977 A | 11/1992 | Paurus et al. | |
| 5,280,192 A | 1/1994 | Kryzaniwsky | |
| 5,300,402 A | 4/1994 | Card, Jr. et al. | |
| 5,426,263 A | 6/1995 | Potter et al. | |
| 5,831,833 A | 11/1998 | Shirakawa et al. | |
| 6,068,782 A | 5/2000 | Brandt et al. | |
| 6,084,306 A | 7/2000 | Yew et al. | |
| 6,150,456 A | 11/2000 | Lee et al. | |
| 6,207,595 B1 | 3/2001 | Appelt et al. | |
| 6,242,282 B1 | 6/2001 | Fillion et al. | |
| 6,353,540 B1 * | 3/2002 | Akiba et al. | 361/794 |
| 6,370,012 B1 | 4/2002 | Adae-Amoakoh et al. | |
| 6,395,996 B1 | 5/2002 | Tsai et al. | |
| 6,396,387 B1 | 5/2002 | Hunt et al. | |
| 6,446,317 B1 | 9/2002 | Figueroa et al. | |
| 6,500,350 B1 | 12/2002 | Hunt et al. | |

(Continued)

*Primary Examiner*—C. J Arbes
(74) *Attorney, Agent, or Firm*—Mark Levy; Lawrence R. Fraley; Hinman, Howard & Kattell

(57) ABSTRACT

A method of making a circuitized substrate including a resistor comprised of material which includes a polymer resin and a quantity of nano-powders including a mixture of at least one metal component and at least one ceramic component. The ceramic component may be a ferroelectric ceramic and/or a high surface area ceramic and/or a transparent oxide and/or a dope manganite. Alternatively, the material will include the polymer resin and nano-powders, with the nano-powders comprising at least one metal coated ceramic and/or at least one oxide coated metal component. An electrical assembly (substrate and at least one electrical component) and an information handling system (e.g., personal computer) utilizing such a circuitized substrate are also provided.

23 Claims, 3 Drawing Sheets

U.S. PATENT DOCUMENTS

| | | |
|---|---|---|
| 6,524,352 B2 | 2/2003 | Adae-Amoakoh et al. |
| 6,544,651 B2 | 4/2003 | Wong et al. |
| 6,616,794 B2 | 9/2003 | Hartman et al. |
| 6,704,207 B2 | 3/2004 | Kopf |
| 6,740,701 B2 | 5/2004 | Chacko |
| 6,985,364 B2 * | 1/2006 | Higashitani et al. ......... 361/763 |
| 7,045,897 B2 * | 5/2006 | Egitto et al. ................. 257/759 |
| 7,224,040 B2 * | 5/2007 | Koutsaroff et al. .......... 257/535 |
| 7,236,643 B2 * | 6/2007 | Albertelli et al. ............ 382/270 |
| 7,253,502 B2 * | 8/2007 | Desai et al. .................. 257/642 |
| 7,384,856 B2 * | 6/2008 | Das et al. .................... 438/396 |
| 2006/0154501 A1 * | 7/2006 | Das et al. ...................... 439/91 |
| 2009/0044970 A1 * | 2/2009 | Kosowsky .................. 174/256 |

* cited by examiner

US 7,870,664 B2

METHOD OF MAKING CIRCUITIZED SUBSTRATE WITH A RESISTOR

CROSS REFERENCE TO CO-PENDING APPLICATIONS

This application is a divisional application of Ser. No. 11/172,786, now U.S. Pat. No. 7,235,745 entitled "Resistor Material With Metal Component For Use In Circuitized Substrates, Circuitized Substrate Utilizing Same, Method Of Making Said Circuitized Substrate, And Information Handling System Utilizing Said Circuitized Substrate," filed Jul. 5, 2005, which is a continuation-in-part application of Ser. No. 11/031,074, entitled Capacitor Material With Metal Component For Use In Circuitized Substrates, Circuitized Substrate Utilizing Same, Method Of Making Said Circuitized Substrate, and Information Handling System Utilizing Said Circuitized Substrate", filed Jan. 10, 2005 now U.S. Pat. No. 7,025,607 (inventors: M. Poliks et al).

TECHNICAL FIELD

The present invention relates to providing resistors within circuitized substrates such as printed circuit boards, chip carriers and the like, and more specifically to a method for doing so and to products including such internal components as part thereof. Even more particularly, the invention relates to such methodologies and products wherein the resistors are comprised of nano-powders.

In Ser. No. 11/031,074, there is defined a material for use as part of an internal capacitor within a circuitized substrate which includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface area within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided. This application is assigned to the same assignee as the present invention. Ser. No. 11/172,786 is a continuation-in-part of Ser. No. 11/031,074.

In Ser. No. 11/031,085, entitled "Capacitor Material For Use In Circuitized Substrates, Circuitized Substrate Utilizing Same, Method of Making Said Circuitized Substrate, And Information Handling System Utilizing Said Circuitized Substrate", filed Jan. 10, 2005 (inventors: J. Lauffer et al), there is defined a material for use as part of an internal capacitor within a circuitized substrate wherein the material includes a polymer resin and a quantity of nano-powders of ceramic material having a particle size substantially in the range of between about 0.01 microns and about 0.90 microns and a surface area for selected ones of said particles within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided. This application is assigned to the same assignee as the present invention.

In Ser. No. 10/900,385, entitled "Circuitized Substrate With Internal Organic Memory Device, Method Of Making Same, Electrical Assembly Utilizing Same, and Information Handling System Utilizing Same" and filed Jul. 28, 2004 (inventors: S. Desai et al), there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof. This application is assigned to the same assignee of the present invention.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004 (inventors: F. Egitto et al), there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. This application is also assigned to the same assignee as the present invention.

BACKGROUND OF THE INVENTION

Circuitized substrates such as printed circuit boards (hereinafter also referred to as PCBs), chip carriers, and the like typically are constructed in laminate form in which several layers of dielectric material and conductive material (laminates) are bonded together using relatively high temperature and pressure lamination processes. The conductive layers, typically of thin copper or copper alloy, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable from a future design aspect because of the increased need and demand for miniaturization in today's substrates and products containing same art. In order to increase the available substrate surface area (also often referred to as "real estate"), there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, board "real estate." In response, there have also been efforts to embed discrete passive components within the board, such components often also referred to as embedded passive components. A capacitor or resistor designed for disposition within (e.g., between selected layers) a PCB (board) substrate may thus be referred to as an embedded integral passive component, or, more simply, an embedded resistor or capacitor. Such a capacitor thus provides internal capacitance while a resistor provides internal resistance. The result of this internal positioning is that it is unnecessary to also position such devices externally on the PCB's outer surface(s), thus saving valuable PCB surface area.

As defined in co-pending application Ser. No. 11/031,074 (relating to providing internal capacitors), for a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum}/\text{Dielectric Thickness})$$

where: C is the capacitance and A is the capacitor's area.

Some of the patents listed below, particularly U.S. Pat. No. 5,162,977, mention use of various materials for providing desired capacitance levels under this formula, and many mention or suggest problems associated with the methods and resulting materials used to do so.

As stated in Ser. No. 11/031,074, there have been past attempts to provide internal capacitance and other internal conductive structures, components or devices (one good example being internal semiconductor chips) within circuitized substrates (PCBs), some of these including the use of nano-powders. The following are some examples of such attempts, including those using nano-powders and those using alternative measures.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co (III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm.sup.2, preferably at least 35 nF/cm.sup.2, most preferably 50 nF/cm.sup.2.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,446,317, entitled "Hybrid Capacitor And Method Of Fabrication Therefore", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Inter-connector" and issued Apr. 9, 2002, there is described a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferroelectric ceramic substance having a high dielectric constant. The ferroelectric ceramic substance is typically a nano-powder combined with an epoxy bonding material. According to this patent, the resulting capacitance of the power distribution core is sufficient to totally eliminate the need for decoupling capacitors on a PCB. Use of pre-fired and ground ceramic nano-powders in the dielectric layer poses obstacles for the formation of thru-holes (conductive holes permitting electronic communication between conductive layers of a PCB), however. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to thru-hole formation where the thru-holes are of extremely small diameter, also referred to in the industry as micro-vias due to the presence of the larger particles. Another problem associated with pre-fired ceramic nano-powders is the ability for the dielectric layer to withstand substantial voltage without breakdown occurring across the layer. Typically, capacitance layers within a PCB are expected to withstand at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

The teachings of the above patents and cited co-pending applications are incorporated herein by reference, as are the teachings of the patents listed below.

Generally speaking, with respect to commercially available dielectric powders which have been used in internal conductive structures such as mentioned in some of the above patents, among these being metal titanate-based powders (see, e.g., U.S. Pat. No. 6,150,456, cited above), such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

The present invention, as indicated above, is directed to providing internal resistors for a circuitized substrate, and, more particularly, to the use of a material for the resistor which includes dielectric components in addition to a metal additive. Use of such additives is an important aspect of the invention to assure desired dielectric constants for the material. Use of metal additives in the manner taught herein is also considered unobvious because of the well known property of metals to conduct electricity. As defined herein, however, the additives are sufficiently insulated to prevent adequate contact between particles thereof, thus preventing undesirable electrical current passage while still enabling composition adjustment so as to provide resistances of differing values, depending on the operational requirements needed for the formed circuit(s) of the substrate. A need exists for providing embedded resistors within circuitized substrates such as PCBs which can be accomplished in a facile, relatively inexpensive manner and which assures a final product capable of providing desired circuit resistances. Such a need is particularly significant with respect to PCBs having high density internal thru-holes as defined below. It is believed that such structures (products, such as electrical assemblies, PCBs, etc.) adapted for using such materials, would constitute significant advancements in the art.

The following patents discuss in particular various resistors and how same are used, one of these discussing use within electronic packages including circuitized substrates such as discussed herein.

In U.S. Pat. No. 6,740,701, entitled "Resistive Film" and issued May 25, 2004, there is described a resistive film for use in a potentiometer. The film is in contact with a movable wiper. The film includes a cured polymer resin and a cured thermosetting resin. Conductive particles of carbon black and graphite are dispersed in the film. The conductive particles cause the resins to be electrically resistive. Carbon nano-particles are also dispersed in the film. The nano-particles increase the wear resistance of the resistive film and reduce electrical noise as the wiper moves across the film. In the preparation of an exemplary composition, a polymer solution is made by mixing 10-20 wt. percent of a polymer and 0-10 wt. percent thermosetting resin in 60-80 wt. percent N-methyl pyrrolidone, based upon the total composition. The polymer is mixed with both the conductive and nano-particles to form a paste with a fine particle size. At this point, surfactants and rheological additives may be added if desired to modify the properties of the resistive composition. The particle size range and viscosity of the paste is monitored to get a resistive paste suitable for application in position sensors. The milling time and milling quantity on the ball mill determines the final particle distribution, size and resulting rheology.

In U.S. Pat. No. 6,500,350, entitled "Formation of Thin Film Resistors" and issued Dec. 31, 2002, there is described a method for forming a patterned layer of resistive material in electrical contact with a layer of electrically conducting material. A three-layer structure is formed which comprises a metal conductive layer, an intermediate layer formed of material which is degradable by a chemical etchant, and a layer of resistive material of sufficient porosity such that the chemical etchant for the intermediate layer may seep through the resistive material and chemically degrade the intermediate layer so that the resistive material may be ablated from the conductive layer wherever the intermediate layer is chemically degraded. A patterned photo-resist layer is formed on the resistive material layer. The resistive material layer is exposed to the chemical etchant for the intermediate layer so that the etchant seeps through the porous resistive material layer and degrades the intermediate layer. Then, portions of the resistive material layer are ablated away wherever the intermediate layer has been degraded.

In U.S. Pat. No. 6,396,387, entitled "Resistors For Electronic Packaging" and issued May 28, 2002, there are described thin layer resistors which are formed on an insulating substrate, which resistors may be embedded within a printed circuit board. Preferred resistive materials are homogeneous mixtures of metals, such as platinum, and dielectric materials, such as silica or alumina. Even minor amounts of dielectric material admixed with a metal significantly increase the resistance of the metal. Preferably, the resistive material is deposited on the insulating substrate by combustion chemical vapor deposition (CCVD). In the case of zero valence metals and dielectric material, the homogeneous mixture is achieved by co-deposition of the metal and dielectric material by CCVD. To form discrete patches of the resistive material, substantially any metal-based resistor material, including those based on the noble metals, can be etched away. Thus, a layer of resistive material may be covered with a patterned resist, e.g., an exposed and developed photo-resist, and exposed portions of the underlying layer of resistive material etched away. This patent also describes the formation of thin layer resistors including the insulating substrate, discrete patches of a layer of resistive material, and conductive material in electrical contact with spaced-apart locations on the patches of resistive material layer, such conductive material providing for electrical connection of the resistive material patches with electronic circuitry. Such structures of insulating material, resistive material, and conductive material may be formed by selective etching procedures.

OBJECTS AND SUMMARY OF THE INVENTION

It is, therefore, a primary object of the present invention to enhance the circuitized substrate art by providing a circuitized substrate having the advantageous features taught herein, including a new and unique material that may be used as an internal resistor within the substrate.

It is another object of the invention to provide a method of making such a circuitized substrate which can be accomplished in a relatively facile manner and at relatively low costs.

It is still another object of the invention to provide an electrical assembly capable of using such a circuitized substrate and thus benefiting from the several advantageous features thereof.

It is yet another object of the invention to provide an information handling system capable of utilizing a circuitized substrate as part thereof to thus also benefit from the several advantageous features thereof.

It is still another object of the invention to provide a new and unique material that can be used as part of a resistor within a circuitized substrate.

According to one aspect of the invention, there is provided a method of making a circuitized substrate having circuitry including a resistor as part thereof, the method comprising providing a dielectric layer, forming first and second electrical conductors on the dielectric layer, positioning a quantity of material on the dielectric layer between and in contact with the first and second electrical conductors to form a circuit line of the circuitry, this quantity of material including a polymer resin and a quantity of nano-powders including a mixture of at least one metal component and at least one ceramic component.

According to another aspect of the invention, there is provided a method of making a circuitized substrate having circuitry including a resistor as part thereof, the method comprising providing a dielectric layer having first and second opposite sides and at least one opening therein, forming first and second electrical conductors on the first and second opposite sides of said dielectric layer, respectively, positioning a quantity of material within the at least one opening and in contact with both first and second electrical conductors to form a circuit line of the circuitry, the quantity of material including a polymer resin and a quantity of nano-powders including a mixture of at least one metal component and at least one ceramic component.

According to yet another aspect of the invention, there is provided a circuitized substrate comprising a first dielectric layer, first and second electrical conductors spacedly positioned on the first dielectric layer, and a quantity of material on said first dielectric layer in contact with the first and second electrical conductors, this quantity of material including a polymer resin and a quantity of nano-powders including a mixture of at least one metal component and at least one ceramic component. The first and second electrical conductors and the quantity of material form a circuit line, with the quantity of material being a resistor for the circuit line.

According to a further aspect of the invention, there is provided a circuitized substrate comprising a first dielectric layer, first and second electrical conductors spacedly positioned on the first dielectric layer, and a quantity of material on the first dielectric layer in contact with the first and second electrical conductors, this quantity of material including a polymer resin and a quantity of nano-powders including at least one metal coated ceramic component. The first and second electrical conductors and the quantity of material form a circuit line, with the quantity of material being a resistor for the circuit line.

According to a still further aspect of the invention, there is provided a circuitized substrate comprising a first dielectric layer, first and second electrical conductors spacedly positioned on the first dielectric layer, and a quantity of material on the first dielectric layer in contact with the first and second electrical conductors, this quantity of material including a polymer resin and a quantity of nano-powders including at least one oxide coated metal component. The first and second electrical conductors and the quantity of material form a circuit line, with the quantity of material being a resistor for the circuit line.

According to still another aspect of the invention, there is provided a circuitized substrate comprising a first dielectric layer including first and second opposite sides and an opening therein, first and second electrical conductors positioned on the first and second sides of the first dielectric layer, respectively, and a quantity of material within the opening and in contact with both first and second electrical conductors, this quantity of material including a polymer resin and a quantity of nano-powders including a mixture of at least one metal component and at least one ceramic component. The first and second electrical conductors and quantity of material form a circuit line, said quantity of material being a resistor for said circuit line.

According to yet a further aspect of the invention, there is provided an electrical assembly comprising a circuitized substrate including a first dielectric layer, first and second electrical conductors spacedly positioned on the first dielectric layer, a quantity of material on the first dielectric layer in contact with the first and second electrical conductors, this quantity of material including a polymer resin and a quantity of nano-powders including a mixture of at least one metal component and at least one ceramic component. The first and second electrical conductors and quantity of material form a circuit line, with the quantity of material being a resistor for said circuit line. The assembly also includes at least one electrical component positioned on and electrically coupled to the circuitized substrate.

According to still another aspect of the invention, there is provided an information handling system comprising a housing, a circuitized substrate positioned substantially within the housing and including a first dielectric layer, first and second electrical conductors spacedly positioned on the first dielectric layer, a quantity of material on the first dielectric layer in contact with the first and second electrical conductors, the quantity of material including a polymer resin and a quantity of nano-powders including a mixture of at least one metal component and at least one ceramic component. The first and second electrical conductors and the quantity of material form a circuit line, with the quantity of material being a resistor for this circuit line. The system further includes at least one electrical component positioned on and electrically coupled to the circuitized substrate.

BEST MODE FOR CARRYING OUT THE INVENTION

Figure 1:
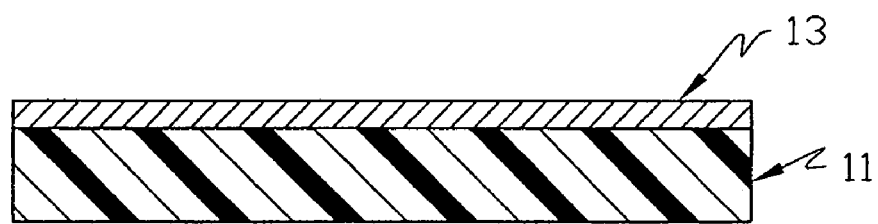
FIGS. 1-3 are much enlarged, side elevational views which illustrate the basic steps of making a circuitized substrate according to one embodiment of the invention.

For a better understanding of the present invention, together with other and further objects, advantages and capabilities thereof, reference is made to the following disclosure and appended claims in connection with the above-described drawings. Like figure numbers are used from FIG. to FIG. to identify like elements in these drawings.

By the term "circuitized substrate" as used herein is meant to include substrates having at least one (and preferably more) dielectric layer and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 2 mils to about 4 mils thick, but also thicker or thinner if desired. Examples of circuitized substrates include printed circuit boards (or cards) and chip carriers when the aforementioned fiberglass-reinforced epoxy resins, polytetrafluoroethylene (Teflon), polyimides, polyamides, cyanate resins and photo-imageable materials are used as the dielectric material. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "doped manganite" as used herein is meant manganites that possess colossal magneto resistance properties. These include perovskite-type oxides of the formula $R_{1x}^{3+}A_x^{2+}Mn_{1-x}^{3+}Mn_x^{4+}O_3$, where R=La, Ce, Nd, Pr, Sm, etc. and A=Ca, Sr or Ba, and combinations or mixtures thereof.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such modules (including one or more chip carriers), semiconductor chips, etc. mounted thereon and coupled to the internal circuitry of the PCB.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "high surface area ceramic" as used herein is meant ceramics that possess low tap density. These include silica, doped silica, silica based composites, titania, doped titania, titania based composites, alumina, doped alumina, alumina based composites, zinc oxide, doped zinc oxide, zinc oxide based composites, and combinations or mixtures thereof.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "metal-coated ceramic" as used herein is meant ceramic particles that possess a metal nano surface coating. These include metal-coated: silica; doped silica; silica-based composites; titania; doped titania; titania-based composites; alumina; doped alumina; alumina-based composites; zinc oxide; doped zinc oxide; zinc oxide-based composites; and combinations or mixtures of such metal-coated materials. Metal nano surface coating materials include gold, silver, aluminum, palladium, platinum, rhodium, and combinations or mixtures thereof.

By the term "oxide coated metal" as used herein is meant metal particles that possess an oxide nano surface coating. Examples of such metals adapted for having such oxide coatings include gold, silver, aluminum, palladium, platinum, rhodium, and combinations or mixtures thereof. Examples of such oxides include silica, doped silica, silica-based composites, titania, doped titania, titania-based composites, alumina, doped alumina, alumina-based composites, zinc oxide, doped zinc oxide, zinc oxide-based composites, and combinations or mixtures thereof.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. These openings are formed typically using mechanical drilling or laser ablation.

By the term "transparent oxide" as used herein is meant oxides that are transparent in the visible wavelength spectrum. These include tin dioxide, indium tin oxide, and combinations or mixtures thereof.

In FIG. 1, a layer 11 of dielectric material is provided, this material selected from one of the above listed. Atop this layer is at least one electrical conductor 13, preferably of copper or copper alloy. In one embodiment, conductor 13 is formed from a larger sheet of material bonded (e.g., laminated in solid sheet form using conventional PCB processing) to layer 11 and then subjected to known photolithographic processing used in the PCB industry, to finally define the conductor's configuration. Alternatively, conductor 13 may be formed using conventional sputtering operations in which a seed layer is typically provided following which at least one conductive layer is sputtered there-over. In these embodiments, layer 11 may possess a thickness of from about one mil to about twenty mils (a mil being one-thousandths of an inch) while conductor 13 may include a thickness of from about 0.2 mils to about 2.5 mils. As understood from the following, conductor 13 is to form part of a circuit line for the invention.

Figure 4:
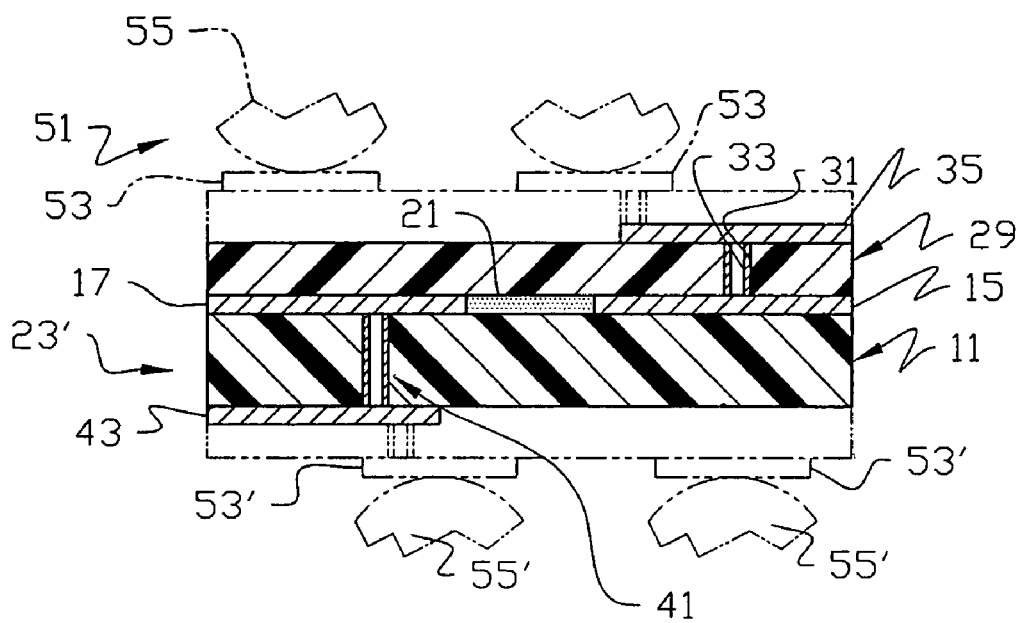
FIG. 4 is a partial, side elevational view, on approximately the same scale as FIGS. 1-3, which illustrates an example of a multi-layered circuitized substrate which can be made using the teachings of the invention, this substrate including a plurality of thru-holes and additional dielectric and conductive layers over the relatively simpler embodiment shown in FIG. 1.

The next step, optional but preferred if an additional dielectric layer is to be secured atop conductor 13 (following processing as defined hereinbelow) to form additional circuitry (also preferred), such as shown in FIG. 4, involves treating conductor 13 to enhance the adhesion of the surface thereof, for the purpose of providing increased adhesion for the subsequently deposited dielectric. To accomplish this, it is preferred to subject the exposed, upper surface to an oxide (or oxidation) alternative process. One good example of such a process involves exposing the conductor to what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. As stated, this process is also referred to as an oxide alternative process, meaning that it does not result in the formation of oxide layers on the treated material. By way of example, the RMS roughness (a standard measurement means) value for the upper surface of conductor 13 after subjecting to the BondFilm "process" may be about 0.6 microns with a peak of about 1.2 to about 2.2 microns. The BondFilm process involves immersing the conductor in the solution for a period of from about 5 to about 120 seconds at a solution temperature of about 20 to 35 degrees Celsius (C.). As part of this treatment, the external surfaces of the conductor are initially cleaned and degreased, following which a micro-etch of the surface occurs. Finally, a thin organic coating is applied. In one example, this thin organic coating is benzotriazole and possesses a thickness of from about 50 Angstroms to about 500 Angstroms. This thin coating remains on the external surfaces of the conductor during subsequent processing. Because it is so thin, it is not shown in the drawings. Other examples of alternative oxide processes which can be utilized with the invention are known in the industry and further description is not deemed necessary.

Figure 2:
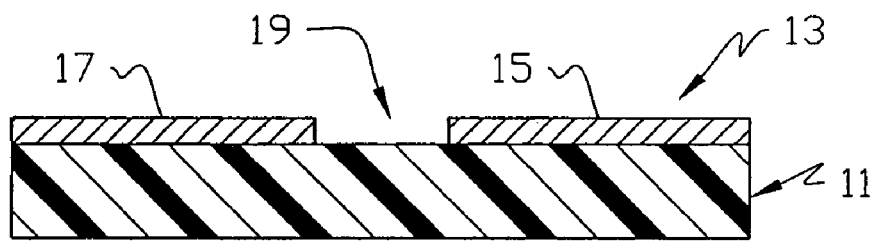

In FIG. 2, conductor 13 is processed to form at least two conductors 15 and 17, spaced apart from each other as shown. By the term "spaced apart" means these conductors are not in physical contact with one another. The spacing shown in FIG. 2 is not, therefore, a hole or other opening within a solid structure. A preferred method of providing such spacing is to subject the conductor 13 to conventional photolithographic processing in which photo-resist is applied, patterned and developed (removed in selected locations). An etchant (e.g., cupric chloride) is then applied to the exposed surfaces and the material therein is etched away. Finally, a rinse (e.g., de-ionized water) is used to wash away the material and any residue. Spacing 19 is the result. Although only one spacing 19 is shown in FIG. 2, it is understood that in a preferred embodiment, several such spacings (and resulting resistors) may be formed atop dielectric 11. As such, there would be several pairs of spaced conductors, each of which may in turn be an end of a line (or "trace" as often described in the substrate art) which forms a circuit line for the final substrate. As understood, several such circuit lines (and resistors) may be simultaneously formed using the teachings of the invention. In one more specific example, it is possible to form as many as 10,000 circuit lines including resistors as part thereof within a single layer of a circuit board.

Figure 3:
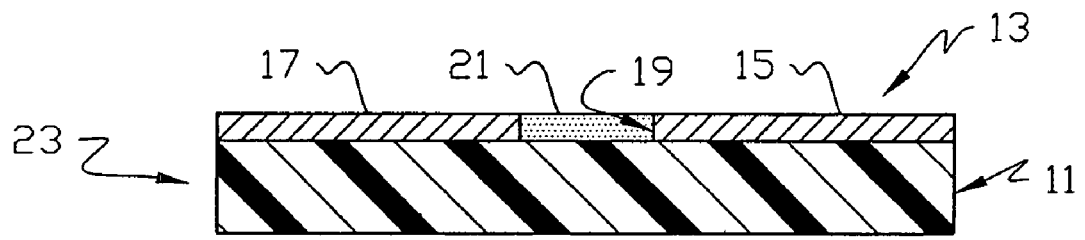

In FIG. 3, a quantity of resistor material 21 is deposited within opening 19, preferably using screen or stencil printing. Several examples of this material are provided in detail below. Briefly, this material comprises a polymer resin (e.g., a cycloaliphatic epoxy resin) and a quantity of nano-powders including a metal component (e.g., silver) and a ceramic component (e.g., barium titanate). If the ceramic is a ferroelectric ceramic, a preferred embodiment, the nano-particles preferably have a particle size substantially within the range of from about 0.01 microns to about 0.90 microns and a surface area within the range of from about two to about twenty square meters per gram. In addition to barium titanate, other ferroelectric ceramics which can be successfully used in this invention include substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof. Metals other than silver may also be used for the metal component, including gold, platinum, copper, nickel, palladium, aluminum and combinations or alloys thereof. One purpose of the metal component in the composition is to establish the resistance of the formed circuit line including the resistor material as part thereof, while further assuring improved electrical characteristics of the resistor (e.g. reduced dielectric loss, improved temperature and frequency stability, etc.). A secondary purpose of the metal component is to establish the coefficient of thermal expansion (CTE) of the final mixture such that the mixture's CTE more closely approximates the CTE of the final (laminated) substrate and the conductors to which it is joined. The addition of the metal component to the mixture is, therefore, a very important feature of this invention. An important advantage of such closer CTE values is reduced stress within the resulting laminated substrate during substrate operation.

Figure 4A:
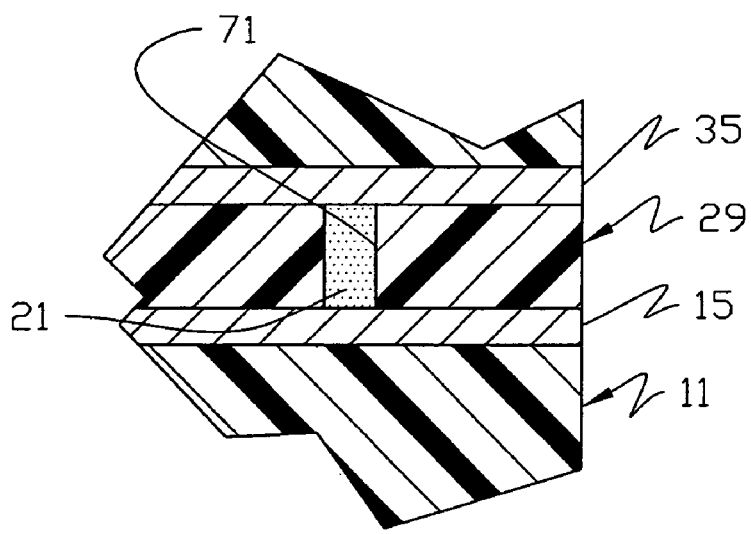
FIG. 4A is a partial, much enlarged side elevational view over the views of FIGS. 1-4, which illustrates an alternative embodiment of a resistor which may be formed using the teachings of the instant invention.

Significantly, the nano-powders used herein are not fired, and, equally significant, are of such a small size and of a surface area so as to enable effective formation of resistive structures (including when used in openings in the dielectric as shown in FIG. 4A) of such small scale that high density circuit patterns, including those with thru-holes of the type defined above, may be formed. Such thru-holes may be of extremely small diameter (in one example, as small as one to two mils) to thereby assure such miniaturized, high density circuit patterns. As indicated, such miniaturization is deemed extremely important with respect to the designs of many present day circuitized substrates. In accomplishing printing of this resistive material, a screen or stencil (not shown) is positioned over conductors 15 and 17 and the material is forced there-though, e.g., using a squeegee or blade. Material 21 substantially fills opening 19 and thus physically contacts the respective ends of conductors 15 and 17. Material 21 may also overlap the ends of the spaced apart conductors 15 and 17 by a sufficient distance to minimize possible registration errors. In one example, this overlap is about 5 mils. In one embodiment, resistor material 21 may be deposited in paste-like form. However, it is also possible to apply material 21 as a liquid, dispensing it through a suitable nozzle (not shown) to fill opening 19. Use of ink jet printing apparatus having nozzles associated therewith may be used for this. Following dispense, material 21 is now "B-staged" to raise it to a more hardened state than as so dispensed. The resulting metal particles of resistor material 21 so formed may thus include an oxide coating thereon or may include a coating of the polymer resin material which forms part of the composition as defined. As such, these particles do not form a single continuous conductive path through the resistor material 21.

In another example, material 21 may include a polymer resin as defined herein and a quantity of nano-powders including a mixture of at least one metal component as defined herein and at least one high surface area ceramic component, the nano-particles of the high surface area ceramic component having a particle size substantially within the range of from about 0.01 microns to about 10 microns and a surface area within the range of from about 1 to about 1500 square meters per gram. Another resistor material adapted for use herein is a material which includes a polymer resin as defined and a quantity of nano-powders that comprise a mixture of at least one metal coated ceramic component, the nano-particles of the metal coated ceramic component having a particle size substantially within the range of from about 0.01 microns to about 10 microns. In this embodiment, it is thus understood that the ceramic component is coated with the metal component, to give a mixture including particles of a combined structure of both components. In yet another embodiment, the resistor material may include a polymer resin of the type defined herein and a quantity of nano-powders which include at least one oxide coated metal component as defined above, the nano-particles of the oxide coated metal component preferably having a particle size substantially within the range of from about 0.01 microns to about 10 microns. Another acceptable resistor material for use herein includes a polymer resin as defined herein and a quantity of nano-powders that comprise a mixture of at least one metal component and at least one transparent oxide component. In this mixture, the nano-particles of the transparent oxide component preferably include a particle size substantially within the range of from about 0.01 microns to about 10 microns, and a surface area within the range of from about 1 to about 100 square meters per gram. Still further, a resistor material having the unique properties defined herein may include a polymer resin as defined herein and a quantity of nano-powders which comprise a mixture of at least one metal component and at least one doped manganite component. In such a mixture, the nano-particles of the doped manganite component preferably have a particle size substantially within the range of from about 0.01 microns to about 10 microns and a surface area within the range of from about 1 to about 100 square meters per gram. For the above embodiments wherein the material includes at least one metal component and the at least one ceramic component is a ferroelectric ceramic or a high surface area ceramic, the mixture may further include a carbon nanotube component.

It is to be understood that the embodiment shown in FIG. 3 represents the simplest embodiment of the invention. Specifically, in the broadest aspects of this invention, the formed circuitized substrate (now referred to as numeral 23 in FIG. 3) may include but a single dielectric layer and single circuit line (with one resistor) as part thereof, the circuit line of course adapted for being coupled to added components such as semiconductor chips, capacitors, etc., none of these shown in FIG. 3 but clearly understood to those skilled in the art.

In FIG. 4, there is shown an example of a circuitized substrate 23' according to a preferred embodiment of the invention (one in which additional dielectric and conductive layers are utilized). Most significantly, substrate 23' represents one example of how the internal resistor formed above is now electrically coupled to other elements of the substrate so as to function therein as desired. In FIG. 4, a second dielectric layer 29 is applied over layer 11 (and conductors 15 and 17), preferably using a lamination procedure known in the art. A preferred material for layer 29 is one of those mentioned above. An opening 31 is then formed, e.g., using a mechanical drill or laser ablation, within layer 29 and, significantly, down to the upper surface of one of the conductors 15 and 17 (in FIG. 4, this is to conductor 15). Opening 31 is then preferably plated with metal 33, e.g., copper, to form a thru-hole within layer 29 which extends from the layer's upper surface to the upper surface of the lower conductor 15. An additional conductor 35 is now formed on the upper surface of layer 29, preferably utilizing conventional photolithographic processing known in the PCB industry. The formed conductive thru-hole is thus electrically coupled to conductor 35 and underlying conductor 15, to electrically interconnect both conductors, and also to couple conductor 35 to conductor 17 through resistor material 21. In a similar manner, a thru-hole 41 may be formed within dielectric layer 11, in addition to yet another additional conductor 43. Still further dielectric layers and thru-holes (shown in phantom in FIG. 4) may be added, depending on the desired operational requirements for the substrate being formed. FIG. 4 thus represents the fact that substrate 23' may include several dielectric and conductive layers, the latter preferably being in the form of signal layers with selected resistors therein. It is also possible for one or more of the conductive layers shown to be a power or ground layer, albeit such a layer would not include one or more resistors as part thereof. In summary, the unique circuitry formed using the teachings herein allows one or more internal resistors to form part of the circuitry, thereby removing the need for same on the substrate's external surfaces.

FIG. 4 also shows that one or more components 51 may be positioned on the upper surface of the substrate 23' and electrically coupled to the internal circuitry thereof. In one example, component 51 (only one shown) may be a semiconductor chip which is solder ball attached to pads 53, the solder balls represented by the numeral 55. At least one pad (to the right) is electrically coupled to a corresponding thru-hole there-under which in turn is part of the defined internal circuitry of substrate 23'. The other pads are understood to also be coupled to other parts of the substrate circuitry. If substrate 23' is to serve as a chip carrier product, it in turn is capable of being electrically coupled to yet another, larger substrate such as a PCB (not shown), using in one embodiment of the invention a second plurality of solder balls 55'. If so used, a second pattern of pads 53' would be formed on the substrate's undersurface, these in turn electrically coupled to the substrate's circuitry. One example of such a connection is represented by the thru-hole shown to the left in the bottom dielectric layer bonded to layer 11. It is also within the scope of this invention for substrate 23' to itself function as a PCB, with a chip carrier or other electronic component positioned thereon.

It is thus understood with respect to FIG. 4 that many separate resistive couplings are possible with various conductive elements which form part of or are located on the circuitized substrate. The internal or embedded resistor formed within the substrate is uniquely able to provide such resistance in a variety of circuit combinations, or, simply, within only one such circuit. It is further understood that the examples described and shown herein are not meant to limit the invention, as many additional possibilities exist and are well within the scope of one skilled in the art.

FIG. 4A represents an alternative embodiment of a resistor of the invention. Instead of a thru-hole formed within layer 29, as shown in FIG. 4, an opening 71 is formed (e.g., drilled as described above) through the dielectric material of this layer. Rather than plate the internal walls, a quantity of the resistor material 21 may be deposited within the opening in contact with conductors 15 and 35. As such, a resistor is formed between two different conductive layers of the resulting substrate. Such a resistor may be a single element of a circuit line for the substrate or, as with other resistors formed herein, may be used in series with one or more of such resistors. Several combinations are within the scope of those skilled in the art and further description is not deemed necessary.

Figure 5:
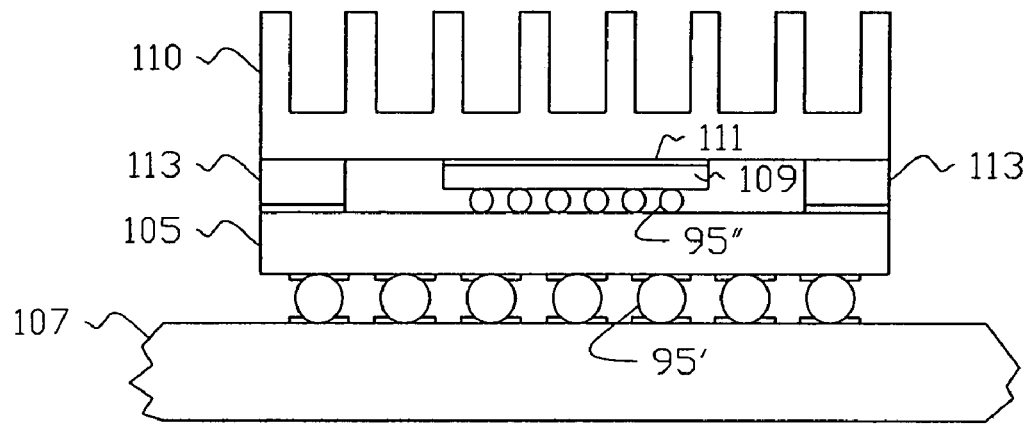
FIG. 5 is a side elevational view, on a smaller scale than FIGS. 1-4A, showing two examples of circuitized substrates which can be manufactured using the teachings of the instant invention.

FIG. 5 represents examples of the structures defined herein-above, the structure referenced by the numeral 105 being a chip carrier, while the structure represented by the numeral 107 is a PCB. Each is capable of including one or more internal resistors of the type defined above as part thereof. Both such PCB and chip carrier assemblies are produced and sold by the Assignee of the invention. In the embodiment (assembly) of FIG. 5, the chip carrier 105 is mounted on and electrically coupled to PCB 107 using a plurality of solder balls 95' (preferably of conventional tin-lead composition as are solder ball connections 55 and 55' in FIG. 4), the chip carrier 105 in turn having a semiconductor chip 109 positioned thereon and electrically coupled to the carrier using the second plurality of solder balls 95" (also preferably of conventional tin-lead composition). The assembly in FIG. 5 may also include a heat sink 110 thermally coupled to the chip 109, e.g., using a conductive paste 111, and positioned on the upper surface of carrier 105 by appropriate standoffs 113, as is known in the art. It is also within the scope of those skilled in the art to utilize an encapsulant material (not shown) to substantially encase the chip and also to possibly eliminate the need for the heat sink if such an encapsulant material is used. Encapsulant material is also possible about the lower pluralities of solder balls 95' and 95". It is even further within the scope of the invention to couple chip 109 using conventional wire-bonding in which a plurality of fine wires (not shown) are bonded between chip conductor sites and corresponding conductor pads on the underlying substrate.

Figure 6:
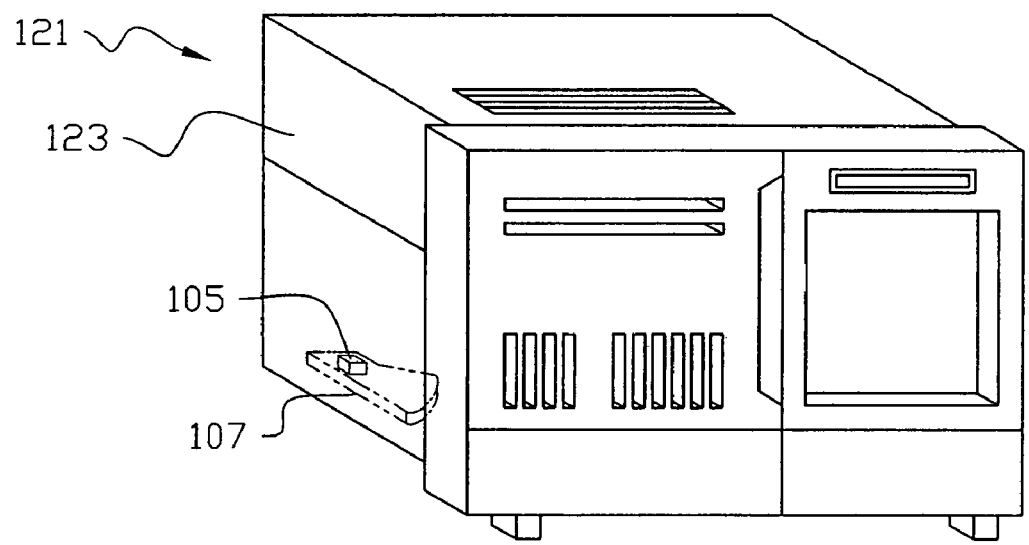
FIG. 6 is a perspective view of an information handling system adapted for using one or more of the circuitized substrates of the instant invention.

In FIG. 6, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein, each including one or more internal resistors as taught above, may be utilized in the system 121 as a PCB 107 (shown hidden) and/or a chip carrier 105 (also shown hidden). The circuitized substrates may be utilized as a "mother board" in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

The following Examples represent various combinations of resistor materials and processes used to form resistors according to various aspects of the invention. These are understood to be examples only and not limiting of the scope of this invention.

Example One 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone was mixed together with 100 of barium titanate (BaTiO3) powder available from Cabot Corporation, Boyertown, Pa. ((50 gm BaTiO3 with mean particle size=0.065 micron, surface area=16 m2/gm) and (50 gm BaTiO3 with mean particle size=0.12 micron, surface area=8.2 m2/gm)), 13 gm propylene glycol methyl ether acetate) and 12 gm methyl ethyl ketone) and ball milled for 3 days. After 3 days of ball milling, a homogeneous slurry was observed. 50 gm of this mixed slurry was then mixed with 30 gm silver nano-powders available from Cima NanoTech, Inc., North Industrial Park, Caesarea, Israel, having a D90 particle size of 0.07 micron (D90 meaning 90% of the particles have a diameter less than or equal to 0.07 micron) and 20 gm methyl ethyl ketone, and ball milled for 5 days. This mixed composite was then deposited on a dielectric substrate surface between and in contact with two conductors and dried at approximately 140° C. for 3 minutes in an oven to remove residual organic solvents. This was followed by curing in an oven at 190° C. for 2 hours. The resulting material possessed a volume resistivity of about $1 \times 10^{-4}$ ohm-cm.

Example Two 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone was mixed together with 100 gm of barium titanate (BaTiO3) powder available from Cabot Corporation, Boyertown, Pa. ((50 gm BaTiO3 with mean particle size=0.065 micron, surface area=16 m2/gm) and (50 gm BaTiO3 with mean particle size=0.12 micron, surface area=8.2 m2/gm)), 13 gm propylene glycol methyl ether acetate) and 12 gm methyl ethyl ketone) and ball milled for 3 days. After 3 days of ball milling, an homogeneous slurry was observed. 50 gm of this mixed slurry was then mixed with 30 gm silver nano-powders available from Cima NanoTech, Inc., North Industrial Park, Caesarea, Israel, having a D90 particle size of 0.07 micron (D90 meaning 90% of the particles have a diameter less than or equal to 0.07 micron), 1 gm carbon nanotubes, and 20 gm methyl ethyl ketone, and ball milled for 5 days. This mixed composite was then deposited on a dielectric substrate surface between and in contact with two conductors and dried at approximately 140° C. for 3 minutes in an oven to remove residual organic solvents. This was followed by curing in an oven at 190° C. for 2 hours. The resulting material possessed a volume resistivity of about $5 \times 10^{-5}$ ohm-cm.

Example Three 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone was mixed together with 100 gm of barium titanate (BaTiO3) powder available from Cabot Corporation, Boyertown, Pa. ((50 gm BaTiO3 with mean particle size=0.065 micron, surface area=16 m2/gm) and (50 gm BaTiO3 with mean particle size=0.12 micron, surface area=8.2 m2/gm)), 13 gm propylene glycol methyl ether acetate) and 12 gm methyl ethyl ketone) and ball milled for 3 days. After 3 days of ball milling, an homogeneous slurry was observed. 50 gm of this mixed slurry was then mixed with 30 gm silver nano-powders available from Cima NanoTech, Inc., North Industrial Park, Caesarea, Israel, having a D90 particle size of 0.07 micron (D90 meaning 90% of the particles have a diameter less than or equal to 0.07 micron), 1 gm surface oxidized Copper(Cu) powder, having a mean particle size of 0.3 micron, and 20 gm methyl ethyl ketone, and ball milled for 5 days. This mixed composite was then deposited on a dielectric substrate surface between and in contact with two conductors and dried at approximately 140° C. for 3 minutes in an oven to remove residual organic solvents. This was followed by curing in an oven at 190° C. for 2 hours. The resulting material possessed a volume resistivity of about $4 \times 10^{-4}$ ohm-cm.

Example Four 22 gm of the above Cabot BaTiO3 powder, having a mean particle size of 0.12 micron and surface area of about 8.2 m²/gm, and 16 gm of Cima Nano Tech silver nano-powders having a D90 particle size of 0.07 micron was mixed together with 15 gm of "LZ 8213" epoxy novolac resin containing about 35 wt % methyl ethyl ketone and 30 gm methyl ethyl ketone, and ball milled for 3 days until an homogeneous slurry was observed. This mixed composite was then deposited on a substrate in contact with two conductors and dried at approximately 140° C. for 3 minutes in an oven to remove residual organic solvents. This was followed by curing in an oven at 190° C. for 2 hours. The resulting film possessed a volume resistivity of about $4 \times 10^{-4}$ ohm-cm.

Example Five 22 gm of the above Cabot BaTiO3 powder, having a mean particle size of 0.12 micron and surface area of about 8.2 m²/gm, and 16 gm of Cima Nano Tech silver nano-powders having a D90 particle size of 0.07 micron, and 2 gm lanthanum calcium manganite ($La_{2/3}Ca_{1/3}MnO_3$) powder, having a mean particle size of 0.02 micron, was mixed together with 15 gm of "LZ 8213" epoxy novolac resin containing about 35 wt % methyl ethyl ketone and 30 gm methyl ethyl ketone, and ball milled for 3 days until an homogeneous slurry was observed. The mixed composite was then deposited on a substrate in contact with two conductors and dried at approximately 140° C. for 3 minutes in an oven to remove residual organic solvents. This was followed by curing in an oven at 190° C. for 2 hours. The resulting film possessed a volume resistivity of about $1 \times 10^{-3}$ ohm-cm.

Example Six 22 gm of the above Cabot BaTiO3 powder, having a mean particle size of 0.12 micron and surface area of about 8.2 m²/gm, and 16 gm of Cima Nano Tech silver nano-powders having a D90 particle size of 0.07 micron and 1 gm indium tin oxide powder, having a mean particle size of 0.2 micron was mixed together with 15 gm of "LZ 8213" epoxy novolac resin containing about 35 wt % methyl ethyl ketone and 30 gm methyl ethyl ketone, and ball milled for 3 days until an homogeneous slurry was observed. This mixed composite was deposited on a substrate in contact with two conductors and dried at approximately 140° C. for 3 minutes in an oven to remove residual organic solvents. This was followed by curing in an oven at 190° C. for 2 hours. The resulting film possessed a volume resistivity of about $5 \times 10^{-4}$ ohm-cm.

Example Seven 2 gm of fumed silica powder, having an average particle size of 0.016 micron and surface area of about 110 m²/gm, and 10 gm of Cima Nano Tech silver nano-powders having a D90 particle size of 0.07 micron was mixed together with 8 gm of "LZ 8213" epoxy novolac resin containing about 35 wt % methyl ethyl ketone and 20 gm methyl ethyl ketone, and ball milled for 3 days until an homogeneous slurry was observed. A thin film of this mixed composite was deposited on a substrate between and in contact with two spaced conductors and dried at approximately 140° C. for 3 minutes in an oven to remove residual organic solvents. This was followed by curing in an oven at 190° C. for 2 hours. The resulting film possessed a volume resistivity of about $2.3 \times 10^{-2}$ ohm-cm.

Example Eight 1.2 gm of the above fumed silica powder, having a average particle size of 0.016 micron and surface area of about 110 m²/gm, and 10 gm of Cima Nano Tech silver nano-powders having a D90 particle size of 0.07 micron was mixed together with 8.5 gm of "LZ 8213" epoxy novolac resin containing about 35 wt % methyl ethyl ketone and 20 gm methyl ethyl ketone, and ball milled for 1 day until an homogeneous slurry was observed. This mixed composite was then deposited on a substrate between two spaced conductors and dried at approximately 140° C. for 3 minutes in an oven to remove residual organic solvents. This was followed by curing in an oven at 190° C. for 2 hours. The resulting film possessed a volume resistivity of about $1 \times 10^{-2}$ ohm-cm.

Example Nine 1 gm of the above fumed silica powder, having an average particle size of 0.016 micron and surface area of about 110 m²/gm, was mixed with 100 ml gold chloride ethanol solution (0.05 gm gold chloride dissolved in 100 ethanol). The mixed solution was stirred to deposit gold on the silica surface. Gold coated silica was then separated using filtration and washing. 1.2 gm of the fumed silica powder, having an average particle size of 0.016 micron and a surface area of about 110 m²/gm, and 0.1 gm gold coated silica, and 10 gm of Cima Nano Tech silver nano-powders having a D90 particle size of 0.07 micron was mixed together with 8.5 gm of "LZ 8213" epoxy novolac resin containing about 35 wt % methyl ethyl ketone and 20 gm methyl ethyl ketone, and ball milled for 1 day until an homogeneous slurry was observed. This mixed composite was deposited on a substrate between two spaced conductors and dried at approximately 140° C. for 3 minutes in an oven to remove residual organic solvents. This was followed by curing in an oven at 190° C. for 2 hours. The resulting film possessed a volume resistivity of about $5 \times 10^{-2}$ ohm-cm.

Thus there has been shown and described a circuitized substrate having one or more internal resistors as part thereof, which substrate can be formed using many conventional PCB processes to thereby reduce costs associated with production thereof. There have also been defined several examples of resistor materials which can be positioned between two adjacent conductors as part of such a circuit line to form circuitry for the substrate. Most significantly, the invention affords the opportunity to vary the resistances between conductors by varying the resistor material composition, as represented by the foregoing examples. Such latitude greatly assists the circuit designer in meeting varying operational requirements.

While there have been shown and described what at present are considered the preferred embodiments of the invention, it will be obvious to those skilled in the art that various changes and modifications may be made therein without departing from the scope of the invention as defined by the appended claims. The invention as defined herein is capable of transmitting both regular and high speed (frequency) signals, the latter at a rate of from about one Gigabits/sec to about ten Gigabits/second, while substantially preventing impedance disruption. It is also capable of being produced using many conventional PCB processes so as to assure reduced cost and facilitate ease of manufacture. That is, the preferred method for assembling the circuitized substrate of the invention preferably involves the use of conventional lamination processes as part of the method, in which the dielectric layers, having the designated circuitry and/or conductive elements (planes) thereon are "stacked up" in aligned manner with one another and subjected to relatively high pressures and temperatures associated with conventional lamination. Of perhaps greater significance, the invention is able to assure circuit pattern miniaturization as is deemed extremely important with regards to many of today's design requirements.

What is claimed is:

1. A method of making a circuitized substrate having circuitry including a resistor as part thereof, said method comprising: providing a dielectric layer; forming first and second electrical conductors on said dielectric layer; positioning a quantity of electrically conductive material on said dielectric layer between and in contact with said first and second electrical conductors to form a circuit line of said circuitry, said quantity of electrically conductive material including a polymer resin and a quantity of nano-powders including a mixture of at least one metal component and at least one ceramic component.

2. The method of claim 1 wherein said first and second electrical conductors are formed using photolithographic processing.

3. The method of claim 1 wherein said first and second electrical conductors are formed using a sputtering operation.

4. The method of claim 1 wherein said positioning of said quantity of material on said dielectric layer between and in contact with said first and second electrical conductors to form a circuit line of said circuitry is accomplished using screen printing.

5. The method of claim 1 wherein said positioning of said quantity of material on said dielectric layer between and in contact with said first and second electrical conductors to form a circuit line of said circuitry is accomplished using stencil printing.

6. The method of claim 1 further comprising bonding at least one additional dielectric layer on said first dielectric layer and at least one additional electrical conductor on said at least one additional dielectric layer, and electrically coupling said at least one additional electrical conductor to said circuit line of said circuitry.

7. The method of claim 6 further comprising forming a thru-hole within said at least one additional dielectric layer, said thru-hole providing said coupling of said at least one additional electrical conductor to said circuit line of said circuitry.

8. The method of claim 7 further comprising positioning a quantity of said material within said thru-hole in contact with said at least one additional electrical conductor and said circuit line of said circuitry.

9. A method of making a circuitized substrate having circuitry including a resistor as part thereof, said method comprising: providing a dielectric layer having first and second opposite sides and at least one opening therein; forming first and second electrical conductors on said first and second opposite sides of said dielectric layer, respectively; and positioning a quantity of material within said at least one opening and in contact with said first and second electrical conductors to form a circuit line of said circuitry, said quantity of material including a polymer resin and a quantity of nano-powders including a mixture of at least one metal component and at least one ceramic component.

10. A method of making a circuitized substrate comprising:
   a) providing a first dielectric layer;
   b) spacedly positioning first and second electrical conductors on said first dielectric layer;
   c) positioning a quantity of resistor material on said first dielectric layer in contact with said first and second electrical conductors, said quantity of resistor material including a polymer resin and a quantity of non-fired nano-powders including a mixture of at least one metal component and at least one ferroelectric ceramic component, said nano-powders having a particle size within the range of from about 0.01 micron to about 0.9 micron and a surface area within the range of from about 2 to about 20 square meters per gram, said particles of said metal component including a coating of said polymer resin thereon such that said metal particles do not form a single continuous conductive path through said resistor material; and
   d) positioning a second dielectric layer over said first and second electrical conductors and said quantity of resistor material, wherein said quantity of resistor material comprises an internal resistor within said substrate.

11. The method of making a circuitized substrate in accordance with claim 10 wherein said positioning a quantity of resistor material step (c) comprises using ink jet printing technology to place said quantity of resistor material.

12. The method of making a circuitized substrate in accordance with claim 10 whereby said resistor material is doped with manganites to provide enhanced magnetoresistance properties.

13. The method of making a circuitized substrate in accordance with claim 10 wherein said ferroelectric ceramic components provide low resistivity resistors.

14. The method of making a circuitized substrate in accordance with claim 10 wherein said nano-powders further comprise transparent oxide for reducing resistivity.

15. The method of making a circuitized substrate in accordance with claim 10 wherein said nano-powders comprise high surface area ceramics.

16. The method of making a circuitized substrate in accordance with claim 10 wherein said nano-powders comprise metal-coated ceramics.

17. The method of making a circuitized substrate in accordance with claim 10 wherein said nano-powders comprise oxide-coated metal.

18. The method of making a circuitized substrate in accordance with claim 10 wherein said first and second electrical conductors are formed using photolithographic processing.

19. The method of making a circuitized substrate in accordance with claim 10 wherein said first and second electrical conductors are formed using a sputtering operation.

20. The method of making a circuitized substrate in accordance with claim 10 wherein said positioning of said quantity of material on said dielectric layer between and in contact with said first and second electrical conductors to form a circuit line of said circuitry is accomplished by one of the groups: using screen printing and using stencil printing.

21. The method of making a circuitized substrate in accordance with claim 10 further comprising:
   e) bonding at least one additional dielectric layer on said first dielectric layer and at least one additional electrical conductor on said at least one additional dielectric layer; and
   f) electrically coupling said at least one additional electrical conductor to said circuit line of said circuitry.

22. The method of making a circuitized substrate in accordance with claim 21 further comprising:
   g) forming a thru-hole within said at least one additional dielectric layer, said thru-hole providing said coupling of said at least one additional electrical conductor to said circuit line of said circuitry.

23. The method of making a circuitized substrate in accordance with claim 22 further comprising:
   h) positioning a quantity of said resistor material within said thru-hole in contact with said at least one additional electrical conductor and said circuit line of said circuitry.

* * * * *